United States Patent
Chikagawa

(10) Patent No.: US 6,455,453 B1
(45) Date of Patent: Sep. 24, 2002

(54) LOW-TEMPERATURE SINTERABLE CERAMIC COMPOSITION AND MULTILAYER CERAMIC SUBSTRATE

(75) Inventor: Osamu Chikagawa, Moriyama (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/684,273

(22) Filed: Oct. 6, 2000

(30) Foreign Application Priority Data

Oct. 12, 1999 (JP) .......................................... 11-289900

(51) Int. Cl.[7] .............................. C03C 8/22; B32B 3/00
(52) U.S. Cl. ........................... 501/120; 501/16; 501/17; 501/21; 501/32; 501/128; 501/166; 428/210
(58) Field of Search ........................... 501/15, 32, 77, 501/108, 121, 16, 21, 17, 66, 120, 128; 428/210, 209

(56) References Cited

U.S. PATENT DOCUMENTS

| | | | |
|---|---|---|---|
| 3,926,648 A | * 12/1975 | Miller | 106/39.6 |
| 4,755,490 A | * 7/1988 | DiLazzaro | 501/17 |
| 4,959,330 A | * 9/1990 | Donohue et al. | 501/8 |
| 5,079,194 A | * 1/1992 | Jean et al. | 501/32 |
| 5,141,899 A | * 8/1992 | Jean et al. | 501/18 |
| 5,260,119 A | * 11/1993 | Jean et al. | 428/210 |
| 5,316,985 A | * 5/1994 | Jean et al. | 501/16 |
| 5,581,876 A | * 12/1996 | Prabhu et al. | 156/320 |

FOREIGN PATENT DOCUMENTS

JP 0820965 A1 1/1998

OTHER PUBLICATIONS

WPI Abstract Accession No. 1987–337789[48] & JP620241867 A (Asahi Glass) Oct. 22, 1987. See Abstract. No. Month.

* cited by examiner

*Primary Examiner*—Cathy Lam
(74) *Attorney, Agent, or Firm*—Ostrolenk, Faber, Gerb & Soffen, LLP

(57) ABSTRACT

A low-temperature sinterable ceramic composition which can be simultaneously sintered with a low melting point metal, such as silver or copper, and which has a preferable combination of high strength and superior electrical characteristics. The low-temperature sinterable ceramic composition is formed by mixing a ceramic component comprising an MgO crystal phase and an $MgAl_2O_4$ crystal phase and a glass component composed of 13 to 50 wt % silicon oxide, 3 to 30 wt % boron oxide, and 40 to 80 wt % alkaline earth oxide.

19 Claims, 1 Drawing Sheet

LOW-TEMPERATURE SINTERABLE CERAMIC COMPOSITION AND MULTILAYER CERAMIC SUBSTRATE

BACKGROUND OF THE INVENTION

1. Field of the Invention

The present invention relates to low-temperature sinterable ceramic compositions that can be simultaneously sintered with low melting point metals, such as silver and copper, and to multilayer ceramic substrates using the same.

2. Description of the Related Art

Recently, in information processing apparatus represented by, for example, computers and mobile communication systems, which sustain the information-oriented society, higher information processing speeds, miniaturization, and multifunctionality have progressed significantly. Improvements in performance of the information processing apparatus are primarily realized by use of semiconductor devices, which are highly integrated, and have higher processing speed and improved functionality.

Conventionally, multilayer ceramic substrates are used for mounting semiconductor devices and the like thereon. Multilayer ceramic substrates typically have insulating substrates composed of alumina, which must be baked at 1,500 to 1,600° C. In order to be able to simultaneously bake such a substrate with a material used for internal wiring, a high melting point metal, such as molybdenum (Mo), molybdenum-nickel (Mo—Ni), or tungsten (W), must be used as the material for the internal wiring. However, these high melting point metals mentioned above have high resistivities and make it more difficult to fully exploit the performance of the semiconductor devices. Thus, higher information processing speed and highly dense wiring have been difficult to realize.

One insulating material used for the multilayer ceramic substrate described above, a ceramic composition composed of MgO and $Al_2O_3$, in which the $Al_2O_3$ is primarily composed of the $MgO \cdot Al_2O_3$ phase, is disclosed in Japanese Unexamined Patent Application Publication No. 62-241867. The ceramic composition mentioned above is superior in hydration resistance and heat shock resistance and has a low dielectric constant, low tan δ, and high thermal conductivity.

However, since the ceramic composition described above has a high baking temperature of 1,500 to 1,600° C., as is the case with the insulating substrate composed of alumina described above, a high melting point metal, such as Mo, Mo—Ni, or W, must be used as a wiring material for simultaneous baking, whereby there have been limitations on the speed and wiring density that could be obtained.

When a glass component is added to the ceramic composition described above as a sintering auxiliary, the sintering temperature can be decreased; however, depending on the glass component to be used, the strength of the multilayer ceramic substrate may be significantly decreased in some cases. On the other hand, if the strength of the multilayer ceramic substrate is maintained, the Q value may decrease or the dielectric constant may vary, and hence, the characteristics of the substrate may be degraded in some cases.

SUMMARY OF THE INVENTION

Taking into consideration the problems described above, the present invention provides a low-temperature sinterable ceramic composition having an advantageous combination of high strength and superior electrical characteristics, with which a low melting point metal, such as silver or copper, can be simultaneously sintered. The invention also provides a multilayer ceramic substrate using the composition.

Through intensive research by the inventor of the present invention to solve the problems described above, it was discovered that a low-temperature sinterable ceramic composition having desired strength and superior electrical characteristics can be obtained by adding a glass component having a specified composition on a weight ratio basis to a ceramic component having an MgO crystal phase and an $MgAl_2O_4$ crystal phase, followed by mixing.

That is, a low-temperature sinterable ceramic composition of the present invention comprises a ceramic component comprising an MgO crystal phase and an $MgAl_2O_4$ crystal phase and a glass component composed of 13 to 50 wt % silicon oxide, 3 to 30 wt % boron oxide, and 40 to 80 wt % alkaline earth oxide.

In the low-temperature sinterable ceramic composition of the present invention, the glass component may further comprise 10 wt % or less alkali metal oxide.

In the low-temperature sinterable ceramic composition of the present invention, 20 to 80 parts by weight of the glass component may be added to 100 parts by weight of the ceramic component.

In the low-temperature sinterable ceramic composition of the present invention, when the ceramic component is represented by the formula $xMgO—yMgAl_2O_4$ on a weight ratio basis, the x and the y may be such that $10 \leq x \leq 90$ and $10 \leq y \leq 90$, in which $x+y=100$.

The low-temperature sinterable ceramic composition of the present invention may further comprise 3 wt % or less copper oxide.

The low-temperature sinterable ceramic composition of the present invention preferably has a dielectric constant of 9 or less and has a Q value of 400 or more at 10 GHz. In addition, the low-temperature sinterable ceramic composition of the present invention preferably has a flexural strength of 200 MPa or more.

A multilayer ceramic substrate of the present invention comprises an insulating layer composed of the low-temperature sinterable ceramic composition described above and a conductive layer composed of one of a silver-based, a copper-based, and a gold-based conductive material, in which the insulating layer and the conductive layer are laminated with each other.

The multilayer ceramic substrate of the present invention may further comprise a dielectric layer composed of a dielectric ceramic composition formed on the insulating layer by mixing a dielectric ceramic component and a glass component.

According to the low-temperature sinterable ceramic composition of the present invention, a glass component composed of 13 to 50 wt % silicon oxide, 3 to 30 wt % boron oxide, and 40 to 80 wt % alkaline earth oxide is added to and is mixed with a ceramic component having an MgO crystal phase and an $MgAl_2O_4$ crystal phase, and hence, a ceramic composition having a preferable combination of high strength and superior electrical characteristics can be realized, and a low melting point metal, such as silver or copper, can be simultaneously sintered therewith.

According to the multilayer ceramic substrate of the present invention, since the insulating layer is formed of the low-temperature sinterable ceramic composition described above, the conductive layer can be formed of a conductive material having relatively low resistivity, such as a silver-based, a copper-based, or a gold-based material, and as a result, a multilayer ceramic substrate having high strength can be realized which has superior electrical characteristics, and in particular, superior high frequency characteristics.

The above and other features and advantages of the present invention will be apparent from the following detailed description of embodiments of the invention in conjunction with the accompanying drawing.

DESCRIPTION OF EMBODIMENTS OF THE INVENTION

Figure 1:
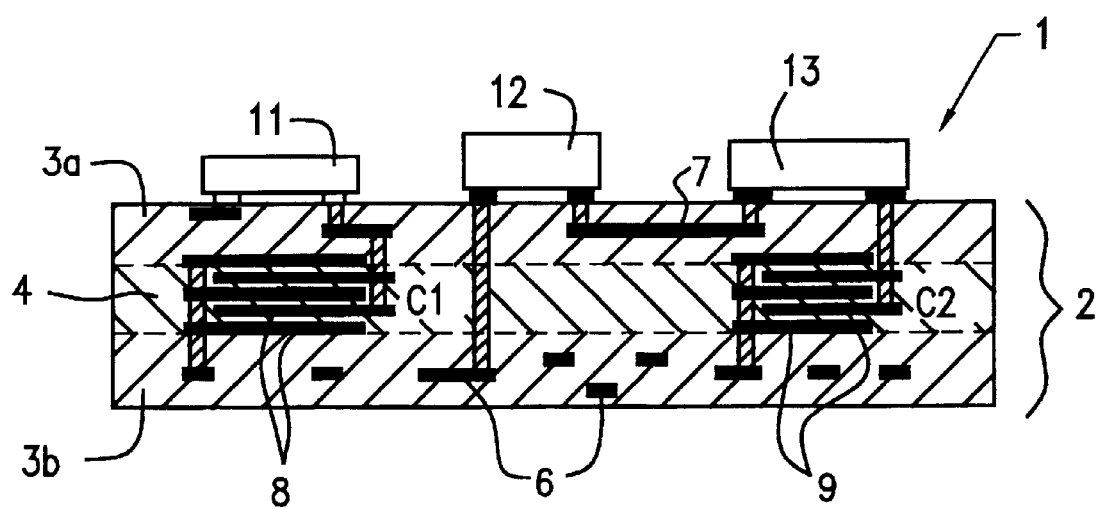
FIG. 1 is a schematic cross-sectional view of a multilayer ceramic substrate of an embodiment of the present invention.

In the present invention, silicon oxide and boron oxide in the glass component described above are reticulate oxides, and the composition of the glass component must be about 13 to 50 wt % silicon oxide as $SiO_2$ and about 3 to 30 wt % boron oxide as $B_2O_3$.

In particular, since $SiO_2$ is a constituent forming the backbone of the glass component, when the content of $SiO_2$ in the glass component is less than about 13 wt %, the degree of the crystallinity of the obtained ceramic composition (hereinafter referred to as a "sintered ceramic") is decreased, and the Q value thereof is also decreased. On the other hand, when the content of $SiO_2$ is more than about 50 wt %, the softened fluidity of the glass component is degraded, and hence, baking of the glass composition at 1,000° C. or less tends to be difficult.

In addition, $B_2O_3$ functions as a fusing agent that lowers the softening temperature and facilitates viscous fluidity of a glass component. When the content of $B_2O_3$ is less than about 3 wt %, the softened fluidity of the glass component is degraded, and hence, baking at 1,000° C. or less tends to be difficult. On the other hand, when the content of $B_2O_3$ is more than about 30 wt %, the degree of the crystallinity of the ceramic composition is decreased, and the strength and the Q value thereof are also decreased.

In addition, since an alkaline earth oxide, such as BaO, SrO, CaO, or MgO, serves to lower the fusing temperature during glass formation and has a function as an accessory oxide that forms a reticulate glass structure, the content thereof in the glass component must be about 40 to 80 wt %. When the content thereof is less than about 40 wt %, the softened fluidity of the glass component is degraded, and hence, baking at 1,000° C. or less tends to be difficult. On the other hand, when the content thereof is more than about 80 wt %, the amount of precipitation of the crystal phases is too large, and the glass structure is unstable, whereby the strength of the ceramic composition is decreased.

In addition, the glass component preferably further contains an alkali metal oxide. An alkali metal oxide, such as $Li_2O$, $K_2O$, or $Na_2O$, serves to lower the fusing temperature during glass formation. That is, when the softened fluidity during glass formation is to be increased, it is sufficient to add the alkali metal oxide mentioned above. However, when the content of alkali metal oxide in the glass component is more than 10 wt %, the Q value of the ceramic composition is decreased, and the electric insulating characteristics thereof may also be degraded in some cases. Accordingly, the content of the alkali metal oxide in the glass component is preferably 10 wt % or less.

In the present invention, there is preferably 20 to 80 parts by weight of the glass component to 100 parts by weight of the ceramic component. When the glass component is less than 20 parts by weight, the softened fluidity during the baking process is decreased, and hence, baking at 1,000° C. or less may tend to be difficult in some cases. On the other hand, when the content of the glass component is more than 80 parts by weight, it is particularly difficult to obtain a dense sintered body having a relative density of 97% or more, the dielectric constant thereof is decreased, and the strength thereof tends to be decreased.

Furthermore, in the present invention, when the ceramic component is represented by the formula $xMgO$—$yMgAl_2O_4$ on a weight ratio basis, it is preferable that x and y be such that $10 \leq x \leq 90$, and $10 \leq y \leq 90$, in which $x+y=100$. That is, in the measurement using an x-ray diffraction method (XRD), is the preferable ceramic component described above, a composite oxide formed of an MgO crystal phase and an $MgAl_2O_4$ crystal phase is precipitated, the content of the MgO crystal phase is 10 to 90 wt %, and the content of the $MgAl_2O_4$ is 10 to 90 wt %.

That is, the desired coefficient of thermal expansion of the ceramic composition can be selected when the composition on a weight ratio basis of the MgO crystal phase and the $MgAl_2O_4$ crystal phase is appropriately set to be in the range described above. For example, when a composition on a weight ratio basis of the MgO crystal phase and the $MgAl_2O_4$ crystal phase is set to be 1 to 1, the coefficient of thermal expansion is approximately 10 ppm/° C. When a weight ratio of the MgO crystal phase is greater than that mentioned above, the coefficient of thermal expansion is increased, and when a weight ratio of the $MgAl_2O_4$ crystal phase is greater than that mentioned above, the coefficient of thermal expansion is decreased. That is, in consideration of the compatibility of the coefficient of thermal expansion of the ceramic composition with that of the dielectric layer and/or that of the electroconductive layer, a desired coefficient of thermal expansion can be obtained in the range of, particularly, 9.2 to 13.2 ppm/° C.

In the ceramic component described above, when the content of the MgO crystal phase is less than 10 wt %, and when the content of the $MgAl_2O_4$ crystal phase is more than 90 wt %, a dense sintered body cannot be obtained by baking at 1,000 ° C. or less, and the Q value in high frequency ranges and the strength of the substrate may be decreased in some cases. On the other hand, when the content of the MgO crystal phase is more than 90 wt %, and when the content of the $MgAl_2O_4$ crystal phase is less than 10 wt %, similarly to the above, sufficient densification of the sintered body cannot be obtained by baking at 1,000° C. or less, and the Q value in high frequency ranges and the strength thereof may be decreased in some cases.

In addition, it is more preferable that the individual crystal phases described above be represented by the formula $xMgO$—$yMgAl_2O_4$ on a weight ratio basis, in which the x and the y are such that $20 \leq x \leq 60$, $40 \leq y \leq 80$, and $x+y=100$. When the crystal phases have the composition on a weight ratio basis as described above, even when the baking temperature is further decreased, a sufficiently dense sintered body can be obtained which has a superior Q value in high frequency ranges and has high strength.

It is even more preferable that the composition of the crystal phases described above be represented by the formula $xMgO$—$yMgAl_2O_4$ on a weight ratio basis, in which the x and the y are such that $30 \leq x \leq 50$, $50 \leq y \leq 70$, and $x+y=100$.

In the ceramic component described above, in order to precipitate individual crystal phases having the composition on a weight ratio basis described above, for example, a starting material composed of powdered $Mg(OH)_2$ and powdered $Al_2O_3$ may be mixed, molded, and baked. In this case, when the composition composed of the individual powdered oxides mentioned above is represented by the formula $aMgO\text{—}bAl_2O_3$ on a molar ratio basis, the individual powdered starting materials may be mixed so that $58 \leq a \leq 97$, and $3 \leq b \leq 42$, in which $(a+b)=100$.

In addition, in the present invention, copper oxide is preferably contained in the low-temperature sinterable ceramic composition. Copper oxide has the effect of improving strength and decreasing losses in the electrical characteristics of the ceramic composition that can be obtained, by promoting the crystallinity of a glass component. However, when the content of copper oxide in the glass component such as CuO exceeds 3 wt %, the Q value of the ceramic composition is decreased, and the dielectric constant tends to increase, whereby the content thereof in the low-temperature sinterable ceramic composition is preferably 3 wt % or less.

According to the ceramic composition having the components described above, after baking, a ceramic layer can be obtained which has a dielectric constant of 9 or less, a Q value of 400 or more at a measured frequency of 10 GHz, and a flexural strength of 200 MPa or more. That is, by baking at a low temperature of 1,000° C. or less, and in particular, at a temperature of 900° C. or less, a ceramic composition can be obtained which has a smaller dielectric constant, a high Q value, and a high strength.

Furthermore, in general, when crystallized glass is contained as a sintering auxiliary, since the types and the ratios of crystal phases to be precipitated greatly depend on the baking process, the baking profile must be strictly controlled. On the other hand, according to the present invention, since the glass component added to the ceramic composition is amorphous glass, the degree of freedom of the baking profile is great, and hence, the production thereof can be relatively easily performed.

Next, the multilayer ceramic substrate of the present invention will be described.

As shown in FIG. 1, a multilayer ceramic substrate 2 of the present invention has a structure in which a dielectric layer 4 composed of a dielectric ceramic composition, which is formed by mixing a dielectric ceramic component and a glass component, is provided between insulating layers 3a and 3b composed of the low-temperature sinterable ceramic composition of the present invention. In addition, in the dielectric layer 4 having a high dielectric constant, capacitors C1 and C2 are formed by internal electrodes 8 and 9, and in the insulating layers 3a and 3b, internal wirings 6 and 7 are formed which are composed of an electroconductive material, such as a silver-based, a copper-based, or a gold-based material. Furthermore, the internal wirings 6 and 7 in the multilayer ceramic substrate 2 are electrically connected with high frequency devices 11 to 13, such as semiconductor devices, the capacitors C1 and C2, and external terminals, thereby together forming a high frequency module 1.

That is, the multilayer ceramic substrate of the present invention can also be applied to high frequency modules provided with various surface-mounted devices thereon, such as, multichip modules. However, the multilayer ceramic substrate of the present invention is not only applied to the multilayer ceramic substrate 2 thus described but is also applied to substrates used for ceramic packages.

Next, a method for manufacturing the multilayer ceramic substrate 2 will be described.

As starting materials for the insulating layers 3a and 3b, a powdered ceramic having an MgO crystal phase and an $MgAl_2O_4$ crystal phase and a powdered glass having a predetermined composition on a weight ratio basis of silicon oxide-boron oxide-alkaline earth oxide are prepared, a predetermined amount of the powdered glass is added to the powdered ceramic, and they are mixed together. Appropriate amounts of an organic binder, a dispersing agent, a plasticizer, an organic solvent, and the like are then added to the obtained powdered mixture, and they are mixed together, whereby a slurry for insulating layers is yielded. Subsequently, the slurry for insulating layers is formed into sheets by a doctor blade method or the like, thereby yielding ceramic green sheets for the insulating layers.

In the meantime, as a starting material for the dielectric layer 4 having a high dielectric constant, a powdered dielectric ceramic composed of, for example, a barium titanate-based material, is prepared and is then baked at 1,000° C. for 1 hour or more. The baked starting material is pulverized and is then mixed with $SiO_2\text{—}B_2O_3$-based powdered glass, so that a powdered dielectric ceramic is formed. Subsequently, appropriate amounts of an organic vehicle, a dispersing agent, a plasticizer, an organic solvent, and the like are added to the powdered dielectric ceramic thus formed, and they are mixed together, thereby forming a slurry for the dielectric layers. The slurry for the dielectric layers is formed into sheets by a doctor blade method or the like, thereby yielding ceramic green sheets for the dielectric layers.

The ceramic green sheets for insulating layers and the ceramic green sheets for dielectric layers thus formed are, when necessary, provided with openings to form via holes, and a conductive paste or conductive powder is filled in the openings, thereby forming the via holes. A conductive paste is printed on the ceramic green sheets for dielectric layers so as to form the capacitors C1 and C2, and when necessary, conductive patterns are formed on the ceramic green sheets for insulating layers. Subsequently, the ceramic green sheets for dielectric layers and the ceramic green sheets for insulating layers are laminated.

Next, the laminated ceramic green sheets thus formed are pressed, and a laminated block is formed. When necessary, the block thus formed may be cut to an appropriate size, or grooves may be formed therein. The block thus formed is heated to 1,000° C. or less, whereby the multilayer ceramic substrate 2 is obtained which has the capacitors C1 and C2, and the like therein, as shown in FIG. 1. When the surface-mount devices 11 to 13, such as semiconductor devices and chip capacitors, are mounted on the multilayer ceramic substrate 2, similarly to the above, the high frequency module 1 shown in FIG. 1 is obtained.

Alternatively, the dielectric layer 4 may be formed in a manner in which a powdered dielectric ceramic mixture is dispersed in an organic vehicle, an organic solvent, a plasticizer, or the like so as to form a paste, and the dielectric paste thus formed is printed on portions where it is needed. In this case, after formation of the dielectric layer, a multilayer ceramic substrate may be formed by the steps of laminating green sheets, pressing, cutting, baking, and the like.

As has thus been described, in the multilayer ceramic substrate 2, since the capacitors C1 and C2 are formed therein, the number of surface-mount devices is reduced, so that miniaturization and higher mounting density of the multilayer ceramic substrate 2 can be achieved. In addition, since the dielectric layer 4 having a high dielectric constant is provided between the electrodes forming the capacitors, a capacitor having great capacitance can be formed by a relatively small electrode pattern.

In addition, since the insulating layers 3a and 3b are formed of the low-temperature sinterable ceramic composition of the present invention, superior electrical characteristics, such as superior insulating properties and a high Q value, can be obtained. Furthermore, since the internal wirings 6 and 7 are formed of a conductive material having low resistivity, such as a silver-based (including Ag/Pd, Ag/Pt, and the like), a copper-based, or a gold-based material, the multilayer ceramic substrate 2 having superior high frequency characteristics is formed.

In addition, when a glass component, which has a composition nearly equivalent to that of the glass component forming the low-temperature sinterable ceramic composition of the present invention, is added to the dielectric layer 4, cohesion between the dielectric layer and the insulating layer can be even further improved.

Furthermore, in the multilayer ceramic substrate 2, since the composition of $MgO/MgAl_2O_4$ on a weight ratio basis of the ceramic component forming the insulating layers 3a and 3b can be optionally selected, the insulating layer can be designed so as to be in conformity with the characteristics (specifically, coefficient of thermal expansion) of the dielectric layer 4, and as a result, a highly reliable multilayer ceramic substrate can be obtained which has superior adhesive strength and less warping and distortion.

EXAMPLES

Hereinafter, the present invention will be described with reference to specific examples.

First, as starting materials for a glass component, $SiO_2$, $B_2O_3$, CaO, $Li_2O$, and CuO (include precursors thereof) were respectively prepared, and they were mixed so as to produce the compositions shown in Table 1 below. The mixed starting materials thus formed were then melted in a Pt-Rh crucible at 1,400 to 1,600° C., and they were quenched and were then pulverized, whereby powdered glasses labeled glasses #A to #M in Table 1 below were obtained.

TABLE 1

| GLASS # | COMPOSITION OF GLASS COMPONENT (wt %) | | | | |
|---|---|---|---|---|---|
| | $SiO_2$ | $B_2O_3$ | CaO | $Li_2O$ | CuO |
| A | 27 | 25 | 40 | 7 | — |
| B | 15 | 30 | 50 | 5 | — |
| C | 55 | 20 | 20 | 5 | — |
| D | 18 | 33 | 40 | 9 | — |
| E | 13 | 3 | 82 | 2 | — |
| F | 20 | 20 | 48 | 12 | — |
| G | 35 | 20 | 41 | 4 | — |
| H | 20 | 25 | 47 | 8 | — |
| I | 50 | 8 | 40 | 2 | — |
| J | 40 | 2 | 50 | 8 | — |
| K | 12 | 24 | 54 | 10 | — |
| L | 27 | 25 | 40 | 4 | 3 |
| M | 27 | 25 | 40 | 3 | 4 |

Next, as starting powdered materials, $Mg(OH)_2$ and $Al_2O_3$ were prepared so that compositions on a weight ratio basis of crystal phases precipitated after baking were in accordance with the compositions in Tables 2 and 3 shown below, and they were wet-mixed for 16 hours and were then dried. The mixtures thus formed were baked at 1,350° C. for 2 hours and were then pulverized, thereby yielding ceramic components.

Next, the ceramic components and glass components thus formed were mixed together so as to produce the compositions shown in Tables 2 and 3 below, appropriate amounts of binders were added thereto so as to form pellets, and the pellets were molded under a pressure of 2,000 kg/cm$^2$, whereby ceramic molded bodies 12 mm in diameter and 7 mm thick were obtained. Subsequently, the molded bodies were baked at 900 to 1,000° C. for 2 hours, whereby ceramic compositions (sintered bodies) labeled #1 to #49 in Tables 2 and 3 below were formed.

TABLE 2

| | CERAMIC COMPONENT | | GLASS COMPONENT | |
|---|---|---|---|---|
| | | | ADDITION AMOUNT | |
| # | MgO (wt %) | $MgAl_2O_4$ (wt %) | (PARTS BY WEIGHT) | TYPE |
| 1 | 5 | 95 | 90 | B |
| 2 | 10 | 90 | 90 | B |
| 3 | 10 | 90 | 80 | B |
| 4 | 30 | 70 | 70 | A |
| 5 | 40 | 60 | 60 | A |
| 6 | 40 | 60 | 50 | C |
| 7 | 50 | 50 | 20 | A |
| 8 | 50 | 50 | 40 | A |
| 9 | 50 | 50 | 30 | B |
| 10 | 50 | 50 | 20 | B |
| 11 | 50 | 50 | 40 | C |
| 12 | 50 | 50 | 60 | C |
| 13 | 50 | 50 | 70 | D |
| 14 | 50 | 50 | 70 | E |
| 15 | 50 | 50 | 80 | F |
| 16 | 60 | 40 | 60 | A |
| 17 | 60 | 40 | 40 | B |
| 18 | 70 | 30 | 70 | A |
| 19 | 70 | 30 | 60 | B |
| 20 | 80 | 20 | 80 | B |
| 21 | 90 | 10 | 80 | A |
| 22 | 95 | 5 | 80 | B |
| 23 | 50 | 50 | 40 | L |
| 24 | 50 | 50 | 40 | M |
| 25 | 50 | 50 | 18 | B |
| 26 | 30 | 70 | 70 | G |
| 27 | 40 | 60 | 60 | G |
| 28 | 50 | 50 | 50 | G |
| 29 | 60 | 40 | 50 | G |
| 30 | 50 | 50 | 19 | G |

TABLE 3

| | CERAMIC COMPONENT | | GLASS COMPONENT | |
|---|---|---|---|---|
| | | | ADDITION AMOUNT | |
| # | MgO (wt %) | $MgAl_2O_4$ (wt %) | (PARTS BY WEIGHT) | TYPE |
| 31 | 30 | 70 | 70 | H |
| 32 | 40 | 60 | 60 | H |
| 33 | 50 | 50 | 50 | H |
| 34 | 60 | 40 | 50 | H |
| 35 | 80 | 20 | 40 | H |
| 36 | 50 | 50 | 17 | H |
| 37 | 30 | 70 | 70 | H |
| 38 | 40 | 60 | 60 | I |
| 39 | 50 | 50 | 50 | I |
| 40 | 60 | 40 | 50 | I |
| 41 | 80 | 20 | 40 | I |
| 42 | 50 | 50 | 17 | I |
| 43 | 50 | 50 | 50 | J |
| 44 | 50 | 50 | 70 | J |
| 45 | 50 | 50 | 80 | J |
| 46 | 50 | 50 | 50 | K |
| 47 | 50 | 50 | 70 | K |

TABLE 3-continued

| | CERAMIC COMPONENT | | GLASS COMPONENT | |
|---|---|---|---|---|
| | | | ADDITION AMOUNT | |
| # | MgO (wt %) | MgAl$_2$O$_4$ (wt %) | (PARTS BY WEIGHT) | TYPE |
| 48 | 50 | 50 | 80 | K |
| 49 | 50 | 50 | 90 | K |

The dielectric constants and the Q values at 10 GHz of the ceramic compositions #1 to #49 were measured by a dielectric resonator method. In addition, the flexural strengths thereof were measured by a measurement method for flexural strength in accordance with JIS (Japanese Industrial Standard) R1601. The results are shown in Tables 4 and 5 below.

TABLE 4

| # | BAKING TEMPERATURE (° C.) | RELATIVE DENSITY (%) | ε | Q VALUE | FLEXURAL STRENGTH (MPa) |
|---|---|---|---|---|---|
| 1 | 1,000 | 90 | 6.5 | 200 | 130 |
| 2 | 1,000 | 98 | 7.0 | 380 | 200 |
| 3 | 1,000 | 99 | 7.5 | 420 | 200 |
| 4 | 1,000 | 98 | 8.0 | 410 | 200 |
| 5 | 1,000 | 100 | 8.1 | 500 | 250 |
| 6 | 1,000 | 92 | 7.8 | 300 | 120 |
| 7 | 1,000 | 99 | 8.0 | 600 | 230 |
| 8 | 1,000 | 99 | 8.1 | 700 | 220 |
| 9 | 900 | 100 | 8.2 | 800 | 240 |
| 10 | 1,000 | 99 | 8.3 | 400 | 210 |
| 11 | 1,000 | 94 | 8.1 | 350 | 150 |
| 12 | 1,000 | 98 | 8.3 | 300 | 200 |
| 13 | 1,000 | 98 | 8.2 | 350 | 200 |
| 14 | 1,000 | 98 | 8.1 | 250 | 210 |
| 15 | 1,000 | 99 | 8.2 | 130 | 220 |
| 16 | 1,000 | 100 | 8.0 | 800 | 250 |
| 17 | 1,000 | 100 | 8.1 | 600 | 250 |
| 18 | 1,000 | 99 | 8.2 | 580 | 230 |
| 19 | 1,000 | 100 | 8.3 | 550 | 250 |
| 20 | 1,000 | 97 | 8.1 | 500 | 220 |
| 21 | 1,000 | 98 | 8.3 | 350 | 230 |
| 22 | 1,000 | 99 | 8.2 | 200 | 240 |
| 23 | 900 | 99 | 8.1 | 600 | 220 |
| 24 | 900 | 99 | 8.1 | 350 | 230 |
| 25 | 1,000 | 95 | 7.8 | 380 | 160 |
| 26 | 1,000 | 98 | 8.0 | 410 | 200 |
| 27 | 1,000 | 98 | 8.1 | 800 | 210 |
| 28 | 900 | 99 | 8.0 | 750 | 220 |
| 29 | 1,000 | 98 | 8.2 | 700 | 210 |
| 30 | 1,000 | 94 | 7.5 | 320 | 160 |

TABLE 5

| # | BAKING TEMPERATURE (° C.) | RELATIVE DENSITY | ε | Q VALUE | FLEXURAL STRENGTH (MPa) |
|---|---|---|---|---|---|
| 31 | 1,000 | 98 | 8.0 | 410 | 220 |
| 32 | 1,000 | 98 | 8.1 | 810 | 220 |
| 33 | 900 | 99 | 8.0 | 750 | 240 |
| 34 | 1,000 | 98 | 8.2 | 680 | 230 |
| 35 | 1,000 | 97 | 8.0 | 700 | 200 |
| 36 | 1,000 | 91 | 7.4 | 300 | 130 |
| 37 | 1,000 | 98 | 8.0 | 410 | 220 |
| 38 | 1,000 | 98 | 8.1 | 810 | 220 |
| 39 | 900 | 99 | 8.0 | 750 | 240 |
| 40 | 1,000 | 98 | 8.2 | 680 | 230 |
| 41 | 1,000 | 97 | 8.0 | 700 | 200 |
| 42 | 1,000 | 91 | 7.4 | 300 | 130 |
| 43 | 1,000 | 92 | 7.8 | 300 | 130 |
| 44 | 1,000 | 93 | 7.8 | 270 | 140 |
| 45 | 1,000 | 95 | 8.0 | 250 | 140 |
| 46 | 1,000 | 97 | 8.2 | 300 | 190 |
| 47 | 1,000 | 98 | 8.3 | 250 | 200 |
| 48 | 1,000 | 99 | 8.3 | 230 | 210 |
| 49 | 1,000 | 100 | 8.3 | 200 | 230 |

As can be seen from Tables 4 and 5, the ceramic compositions (sintered bodies) of #3 to #5, #7 to #10, #16 to #21, #23, #26 to #41 had high relative densities of 97% or more, and it was understood that they were sintered at 900° C. or at 1,000° C. so as to be dense. In addition, since the dielectric constants εr of these ceramic compositions were all 9 or less (particularly, approximately 8), and since the Q values at 10 GHz thereof were 400 or more, it was understood that these ceramic compositions had superior electrical characteristics. Furthermore, since these ceramic compositions had higher flexural strengths of 200 MPa or more, it was also understood that the strengths of the substrates were also superior.

On the other hand, the ceramic compositions other than those mentioned above, as shown in Tables 4 and 5, had Q values of 400 or less even when the relative densities thereof were high, or they had strengths of 200 MPa or less due to the lower relative densities thereof.

According to the low-temperature sinterable ceramic composition of the present invention, since a glass component composed of 13 to 50 wt % silicon oxide, 3 to 30 wt % boron oxide, and 40 to 80 wt % alkaline earth oxide is added to and is mixed with a ceramic component having an MgO crystal phase and an MgAl$_2$O$_4$ crystal phase, a low-temperature sinterable ceramic composition having a preferable combination of superior strength and superior electrical characteristics can be realized which can be simultaneously sintered with a metal having a low melting point, such as silver or copper.

According to the multilayer ceramic substrate of the present invention, since the insulating layer is formed of the low-temperature sinterable ceramic composition of the present invention, a conductive layer can be formed of a silver-based, a copper-based, or a gold-based conductive material having relatively low resistivity, and hence, a high strength multilayer ceramic substrate having superior electrical characteristics, and in particular, superior high frequency characteristics can be realized.

Although embodiments of the invention have been described, the invention is not limited to those embodiments, but extends to all modifications, variations, equivalents and other uses that would occur to those having the ordinary level of skill in the art.

What is claimed is:

1. A low-temperature sinterable ceramic composition comprising:
   a ceramic component comprising an MgO crystal phase and an MgAl$_2$O$_4$ crystal phase; and
   a glass component comprising 13 to 50 wt % silicon oxide, 3 to 30 wt % boron oxide, and 40 to 80 wt % alkaline earth metal oxide.

2. A low-temperature sinterable ceramic composition according to claim 1, wherein the glass component further comprises 10 wt % or less alkali metal oxide.

3. A low-temperature sinterable ceramic composition according to claim 2, wherein 20 to 80 parts by weight of the glass component is added to 100 parts by weight of the ceramic component.

4. A low-temperature sinterable ceramic composition according to claim 3, wherein the ceramic component is represented by the formula xMgO—yMgAl$_2$O$_4$ on a weight ratio basis, and the x and the y are such that $10 \leq x \leq 90$ and $10 \leq y \leq 90$, in which x+y=100.

5. A low-temperature sinterable ceramic composition according to claim 4, wherein the x and the y are such that $20 \leq x \leq 60$, $40 \leq y \leq 80$, and x+y=100.

6. A low-temperature sinterable ceramic composition according to claim 5, wherein the x and the y are such that $30 \leq x \leq 50$, $50 \leq y \leq 70$, and x+y=100.

7. A low-temperature sinterable ceramic composition according to one of claims 1 to 4, further comprising 3 wt % or less copper oxide.

8. A low-temperature sinterable ceramic composition according to one of claims 1 to 4, wherein the low-temperature sinterable ceramic composition has a dielectric constant of 9 or less and has a Q value of 400 or more at 10 GHz.

9. A low-temperature sinterable ceramic composition according to one of claims 1 to 4, wherein the low-temperature sinterable ceramic composition has a flexural strength of 200 MPa or more.

10. A low-temperature sinterable ceramic composition according to claim 1, wherein 20 to 80 parts by weight of the glass component is added to 100 parts by weight of the ceramic component.

11. A low-temperature sinterable ceramic composition according to claim 10, further comprising 3 wt % or less copper oxide.

12. A low-temperature sinterable ceramic composition according to claim 10, wherein the ceramic component is represented by the formula xMgO—yMgAl$_2$O$_4$ on a weight ratio basis, and the x and the y are such that $10 \leq x \leq 90$ and $10 \leq y \leq 90$, in which x+y=100.

13. A low-temperature sinterable ceramic composition according to claim 12, further comprising 3 wt % or less copper oxide.

14. A low-temperature sinterable ceramic composition according to claim 1, wherein the ceramic component is represented by the formula xMgO—yMgAl$_2$O$_4$ on a weight ratio basis, and the x and the y are such that $10 \leq x \leq 90$ and $10 \leq y$ 90, in which x+y=100.

15. A low-temperature sinterable ceramic composition according to claim 14, further comprising 3 wt % or less copper oxide.

16. A low-temperature sinterable ceramic composition according to claim 14, wherein the glass component further comprises 10 wt % or less alkali metal oxide.

17. A low-temperature sinterable ceramic composition according to claims 16, further comprising 3 wt % or less copper oxide.

18. A multilayer ceramic substrate comprising:
   an insulating layer composed of a low-temperature sinterable ceramic composition according to one of claims 1 to 4; and
   a conductive layer composed of one of a silver-based, a copper-based, and a gold-based conductive material;
   wherein the insulating layer and the conductive layer are laminated with each other.

19. A multilayer ceramic substrate according to claim 18, further comprising a dielectric layer formed on the insulating layer composed of a dielectric ceramic composition containing a dielectric ceramic component and a glass component.

* * * * *